United States Patent
Nishikawa et al.

(10) Patent No.: US 9,363,866 B2
(45) Date of Patent: Jun. 7, 2016

(54) TOUCH SWITCH AND VEHICLE INTERIOR LIGHTING DEVICE HAVING THE TOUCH SWITCH

(75) Inventors: Yoshikatsu Nishikawa, Nagoya (JP); Naoya Hanada, Toyota (JP)

(73) Assignee: TOYOTA BOSHOKU KABUSHIKI KAISHA, Aichi-Ken (JP)

( * ) Notice: Subject to any disclaimer, the term of this patent is extended or adjusted under 35 U.S.C. 154(b) by 944 days.

(21) Appl. No.: 13/606,397

(22) Filed: Sep. 7, 2012

(65) Prior Publication Data

US 2013/0088175 A1 Apr. 11, 2013

(30) Foreign Application Priority Data

Oct. 7, 2011 (JP) .................................. 2011-223351

(51) Int. Cl.
| | |
|---|---|
| B23K 11/24 | (2006.01) |
| H05B 37/02 | (2006.01) |
| H03K 17/96 | (2006.01) |
| H05B 33/08 | (2006.01) |

(52) U.S. Cl.
CPC .......... *H05B 37/0227* (2013.01); *H03K 17/962* (2013.01); *H05B 33/0806* (2013.01); *H01H 2239/074* (2013.01)

(58) Field of Classification Search
USPC ........................................................ 307/112
See application file for complete search history.

(56) References Cited

U.S. PATENT DOCUMENTS

| | | | | |
|---|---|---|---|---|
| 2006/0119753 A1* | 6/2006 | Luo | ................... | G02F 1/136213 349/38 |
| 2008/0198284 A1* | 8/2008 | Oyamada | .......... | G02F 1/136213 349/39 |
| 2008/0237018 A1* | 10/2008 | Tatehata | ................ | G06F 3/0202 200/5 A |
| 2010/0053114 A1* | 3/2010 | Kaigawa | ................. | G06F 3/044 345/174 |
| 2010/0253646 A1* | 10/2010 | Hiratsuka | ............... | G06F 3/044 345/174 |
| 2011/0242571 A1 | 10/2011 | Ogushi et al. | | |

(Continued)

FOREIGN PATENT DOCUMENTS

| | | |
|---|---|---|
| CN | 102209174 | 10/2011 |
| JP | 2011-046211 | 3/2011 |

OTHER PUBLICATIONS

China Office action, dated May 20, 2014 along with an english translation thereof.

*Primary Examiner* — Rodney Fuller
(74) *Attorney, Agent, or Firm* — Greenblum & Bernstein, P.L.C.

(57) ABSTRACT

A touch switch including: at least two of operation faces provided side by side; a detection electrode provided in each of the operation faces and including a wiring pattern of an electric conductor formed on or immediately below the operation face; and a controller connected to each of the detection electrodes to perform a switching operation by detecting variations of capacitance sensed by each of the detection electrodes, the variation of capacitance being generated when a human body part is in proximity to or in contact with each of the operation faces. At least one of the detection electrodes includes a wiring pattern more sparsely formed in a vicinity area of a boundary with another operation face adjacent thereto compared to a wiring pattern of the detection electrode provided in the adjacent operation face. Therefore, detection errors or accidental operations between adjacent switches can be prevented from happening.

5 Claims, 6 Drawing Sheets

(56) References Cited

U.S. PATENT DOCUMENTS

| | | | |
|---|---|---|---|
| 2014/0002177 A1* | 1/2014 | Noguchi | H03K 17/9622 327/517 |
| 2014/0076612 A1* | 3/2014 | Kuriki | G06F 3/041 174/250 |
| 2015/0002464 A1* | 1/2015 | Nishioka | G06F 3/044 345/174 |
| 2015/0185925 A1* | 7/2015 | Iwami | G06F 3/044 345/174 |
| 2015/0242013 A1* | 8/2015 | Ono | G06F 3/044 345/174 |

* cited by examiner

TOUCH SWITCH AND VEHICLE INTERIOR LIGHTING DEVICE HAVING THE TOUCH SWITCH

CROSS-REFERENCE TO RELATED APPLICATIONS

The present application claims priority under 35 U.S.C. §119 of Japanese Application No. 2011-223351 filed on Oct. 7, 2011, the disclosure of which is expressly incorporated by reference herein in its entirety.

BACKGROUND OF THE INVENTION

1. Field of the Invention

The present invention relates to a touch switch structurally characterized in that a plurality of operation units are provided adjacent to each other and a vehicle interior lighting device equipped with the touch switch, more particularly to a touch switch having an excellent operability and capable of appropriate detecting contacts made by a human body part with the operation units irrespective of sizes, structures, and layout of the operation units, and a vehicle interior lighting device equipped with the touch switch.

2. Description of the Related Art

Conventionally, as a switch for a vehicle interior lighting device, such as a room lamp for vehicle provided in an indoor ceiling of an automobile, a touch switch which detects a capacitance variation caused by contact made by a human body part for a switching operation is considered. The touch switch is structurally characterized in that operation faces can be provided integral with light sources, and illumination can be turned on/off by directly touching a portion of the light sources per se. Therefore, a vehicle interior lighting device where the touch switch is used is compact in size and superior in operability.

In many of the vehicle interior lighting devices, a plurality of light sources, such as a dome lamp which illuminates the whole vehicle interior and spot lamps which respectively illuminate different seats of the vehicle, are arranged side by side in a part of the vehicle ceiling. Therefore, plural operation faces for manipulating the light sources need to be arranged side by side likewise, and detectors of the operation faces provided to detect contacts by a human body part are disposed next to each other. In these vehicle interior lighting devices, unintended operations often start whenever a boundary between the panels or anywhere nearby is accidentally contacted by a human body part. In the case where such an event occurs, it is difficult to decide accurately which one of the operation faces was actually contacted, and therefore, it becomes necessary to avoid any irregular switching operation by preventing the two adjacent operation faces from concurrently responding to the contact.

To deal with the conventional problems, a vehicle interior lighting device was disclosed, wherein an area dimension of a part of the detector currently contacted by a human body part is detected, and light sources to be turned on/off are changed depending on the detected contact area (see the Related Art 1).

Related Art 1 JP-A-2011-46211

In the vehicle interior lighting device disclosed in the Related Art 1, two map lamps and one dome lamp are all provided in a section thereof, and six operation faces are provided as examples of the touch switch for controlling these light sources. An area dimension of an object in proximity of or in contact with any of the operation faces is measured based on a capacitance magnitude, and which of the light sources should be turned on/off is decided through comparison for each of the operation faces.

When a fingertip trying to carry out an operation is near a boundary between two operation faces, however, capacitance variations in the two operation faces are almost equal, making it difficult to decide which of the switches was actually touched.

Another problem is structural restrictions in some of the vehicle interior lighting devices; some regions of these devices may not be available for detection electrodes provided to detect contact made by a human body part, for example, where components are mounted and through holes for light transmission from the light sources are formed, and the capacitance magnitude cannot be accurately detected in the case where these regions are contacted by a human body part. Therefore, a device adapted to detect a contact-based capacitance variation in such regions as well as any other regions is a long-awaited technical solution.

SUMMARY OF THE INVENTION

The present invention is made in consideration of the foregoing situation, and the object of the invention is to provide a touch switch including a plurality of operation faces arranged side by side and having a excellent operability irrespective of the size or internal structure of each operation face wherein even if the vicinity of boundary between adjacent operation faces is touched, a suitable switching operation is possible, and a vehicle interior lighting device equipped with the touch switch.

One aspect of the present embodiments provides a touch switch, comprising:

at least two of operation faces provided side by side;

a detection electrode provided in each of the operation faces and including a wiring pattern of an electric conductor formed on or immediately below the operation face; and a controller connected to each of the detection electrodes to perform a switching operation by detecting variations of capacitance sensed by each of the detection electrodes, the variation of capacitance being generated when a human body part is in proximity to or in contact with each of the operation faces, wherein at least one of the detection electrodes includes a wiring pattern more sparsely formed in a vicinity area of a boundary with another operation face adjacent thereto compared to a wiring pattern of the detection electrode provided in the adjacent operation face.

In a further aspect, the at least two operation faces include a first operation face and a second operation face adjacent to the first operation face and having an smaller area dimension than the first operation face, and a wiring pattern of the detection electrode provided in the second operation face is more densely formed than a wiring pattern of the detection electrode provided in the first operation face.

In a further aspect, a wiring pattern in a center area of the detection electrode provided in the first operation face is denser than a wiring pattern in a vicinity area of a boundary with the second operation face.

In a further aspect, a part of the detection electrode is provided with a non-wiring pattern region, wherein a wiring pattern in a vicinity area of the non-wiring pattern region is denser than a wiring pattern in a peripheral area of the vicinity area of the non-wiring pattern region.

Another aspect of the present embodiments provides a vehicle interior lighting device, including the touch switch according to above aspects, wherein the controller controls relevant lighting of a vehicle interior by detecting a human body part in proximity of or in contact with any of the operation faces.

According to the touch switch provided by the invention, a plurality of operation faces provided adjacent to each other, and a wiring pattern of a detection electrode provided in one operation face is more sparsely formed in the vicinity area of the boundary with other operation faces adjacent thereto compared to a wiring pattern of the detection electrode provided in the adjacent operation face. According to the touch switch thus structurally characterized, a capacitance variation generated when a human body part is near or in contact with the boundary is lessened. Namely, a detection sensitivity for a human body part near the boundary is lower than in the detection electrode of the adjacent operation face. For this reason, when a finger tip as a human body part contacts near the boundary between the two operation faces during the operation, the contact and the like made by the fingertip can be detected by the detection electrode having a higher detection sensitivity where the wiring pattern is relatively dense. Thus, one of the operation faces to be preferentially operated over the other can be previously set in the case where the boundary between the two adjacent operation faces is accidentally contacted during the operation.

Furthermore, a first operation face and a second operation face are provided, the second operation face being adjacent to the first operation face and having an smaller area dimension than the first operation face. When a wiring pattern of a detection electrode provided in the second operation face is more densely formed than a wiring pattern of the detection electrode provided in the first operation face, although a user, trying to touch the small second operation face, may accidentally touch anywhere near the first operation face larger than the second operation face, any intended operation can be detected by the second operation face having a higher detectivity, thereby accomplishing a better operability. Also, in the case where the user happens to touch between the second operation face having a smaller area dimension and the first operation face having a larger area dimension, the smaller operation face can be preferentially operated over the other.

When the wiring pattern in a center area of the detection electrode provided in the first operation face is denser than the wiring pattern in a vicinity area of the boundary with the second operation face, a larger capacitance variation is generated when the center area of the first operation face having a larger area dimension is touched by a human body part, therefore, the center area has a better detectivity. The detection sensitivity in the boundary between the first and second operation faces is lowered, whereas the detection sensitivity in the center area easily touched by a user is increased. The touch switch thus technically characterized, wherein these two different regions consequently have an almost equal detectivity, accomplishes an even better operability.

When a part of the detection electrode is provided with a non-wiring pattern region, and a wiring pattern in a vicinity area of the non-wiring pattern region is denser than a wiring pattern in a peripheral area of the vicinity area of the non-wiring pattern region, contact made by a human body part on the operation face on the non-wiring pattern region can be detected with a higher sensitivity. The touch switch thus technically characterized, wherein contacts of a user with any parts of the operation face can be easily detected irrespective of structural differences of the touch switch, accomplishes an improved operability.

In a vehicle interior lighting device equipped with the touch switch according to the invention, a human body part in proximity thereof or in contact therewith can be detected with an optimal sensitivity in each of a plurality of operation faces and each of different parts of an operation face. Therefore, detection errors or accidental operations between adjacent operation faces can be prevented from happening. Therefore, the vehicle interior lighting device installed in a narrow space where the operation faces are not clearly seen can be comfortably and smoothly handled by a user.

BRIEF DESCRIPTION OF THE DRAWINGS

The present invention is further described in the detailed description which follows, in reference to the noted plurality of drawings by way of non-limiting examples of exemplary embodiments of the present invention, in which like reference numerals represent similar parts throughout the several views of the drawings, and wherein.

DESCRIPTION OF THE PREFERRED EMBODIMENTS

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description is taken with the drawings making apparent to those skilled in the art how the forms of the present invention may be embodied in practice.

1. Touch Switch

Figure 1:
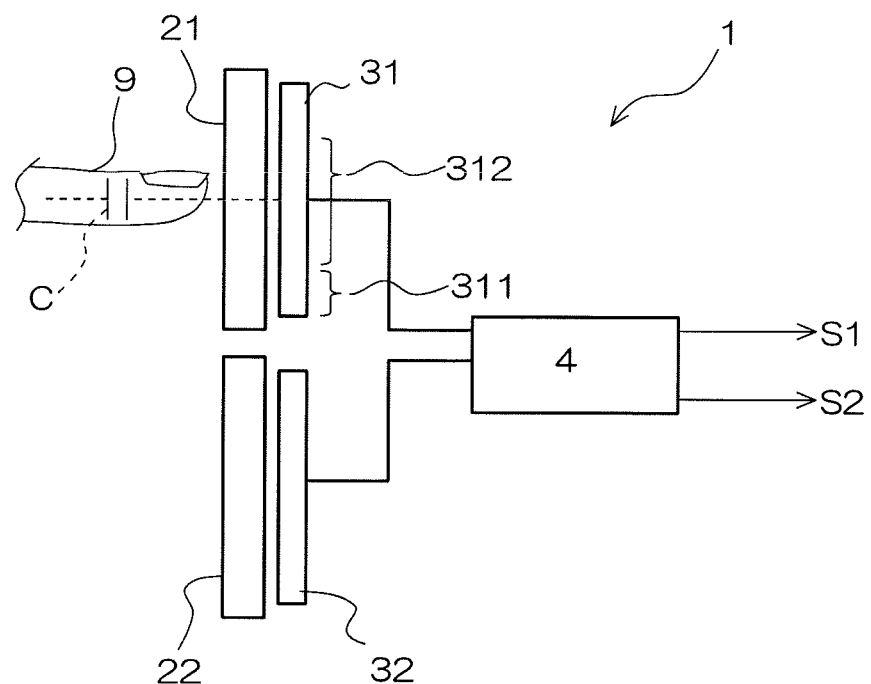
FIG. 1 is a structural block diagram of a touch switch.

FIG. 1 is a block diagram structurally illustrating a touch switch according to an exemplary embodiment of the invention. A touch switch 1 has two operation faces (21, 22) provided adjacent to each other, detection electrodes (31, 32) respectively including wiring patterns of electric conductors formed immediately below the operation faces, and a controller 4 connected to the detection electrodes to perform a switching operation by detecting variations of capacitance sensed by each of the detection electrodes, the variation of capacitance being generated when a human body part (for example, hand or finger) 9 is in proximity to or in contact with each of the operation faces.

The operation faces (21, 22 and the like) refer to faces of operation elements disposed such that a user's hand, fingertip or the like can approach in proximity or contact during the operation by the user. The touch switch described here has at least two operation elements provided side by side. The shapes, sizes, structures, materials or the like of the operation faces are not particularly limited. The operation faces may respectively have different sizes (area dimensions) as far as an arbitrary number of at least two operation faces are provided next to each other. The two adjacent operation faces may be arranged next to each other with or without an interval therebetween. At least two operation faces may be aligned straight with each other or may be arranged longitudinally or laterally. One or more operation faces may be provided distant from the other operation faces.

The detection electrodes (31, 33) are provided on or immediately below the respective operation faces for each operation element. The detection electrodes serve as electrodes for detecting the capacitance variations when the operation faces are approached in proximity or contacted by a human body part. The detection electrode may be provided in a member serving as the operation face or may be provided in a member disposed below the operation face such as a resin board. The detection electrode may be formed by wiring a linear or film-like electric conductor in arbitrary pattern. The structure, material and a method employed to form the wiring pattern or the like of the detection electrode are not particularly limited. The "approach in proximity or (actual) contact with" the operation face by human body part refers to when a user moves his palm, finger or the like closer to the operation face or touches the operation face with his palm or finger (hereinafter, referred to as "human body contact"). At the time of human body contact with the operation face, the body part is in proximity of the detection electrode provided in the operation face. The contact thus made by the body part with the operation face causes a capacitance variation in the detection electrode.

The controller 4 is connected to the detection electrodes (31, 32) provided in the respective operation elements and configured to detect the capacitance variations generated in the detection electrodes at the time of human body contact with the operation faces. A method employed to detect the capacitance variations is not particularly limited. The controller 4 may be provided with, for example, an output circuit which outputs electrical signals (may be direct current signals or alternate current signals) to be supplied to the detection electrodes for capacitance detection, and a measuring circuit which measures the capacitances generated in the detection electrodes. The controller 4 may be configured further to be provided with a determiner which determines whether a human body part is in proximity of or in contact with the operation faces depending on capacitance values of the detection electrodes, and an output which outputs a result of the determination outside. Referring to FIG. 1, the controller 4, for example, may be configured to activate a switch signal S1 when a human body part 9 touches the operation face 21, while activating a switch signal S2 when the human body part 9 touches the operation face 22. Thus, light sources can be turned on/off by the switch signals S1 and S2.

The controller 4 may be configured of hardware or software. The controller 4 preferably includes peripheral circuits, for example, an input/output interface, around a microcontroller (microcomputer) including a CPU, memories (ROM, RAM or the like), and an input/output circuit or the like. The controller 4 may be configured of programmable logic circuits or any other logic circuits such as gate array circuits.

Figure 2A:
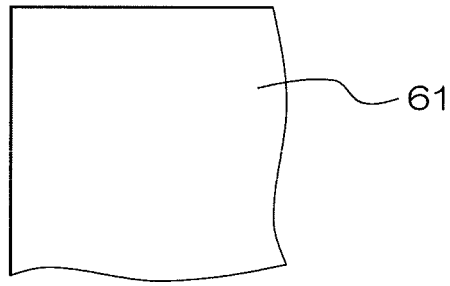
FIG. 2a is a schematic illustration for showing an example of a wiring pattern in the detection electrode provided in the operation face, an electric conductor of the wiring pattern being formed all over.
Figure 2B:
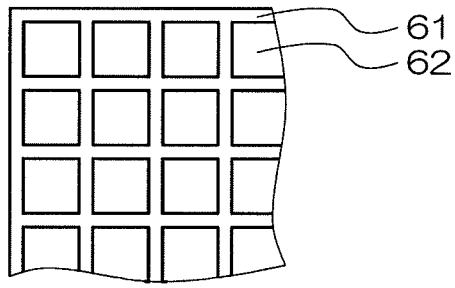
FIG. 2b is a schematic illustration for showing an example of a wiring pattern in the detection electrode provided in the operation face, an electric conductor of the wiring pattern being formed in a dense net-like shape.
Figure 2C:
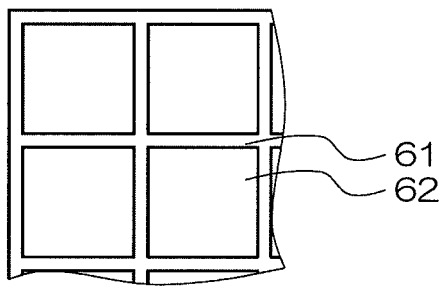
FIG. 2c is a schematic illustration for showing an example of a wiring pattern in the detection electrode provided in the operation face, an electric conductor of the wiring pattern being formed in a sparse net-like shape.
Figure 2D:
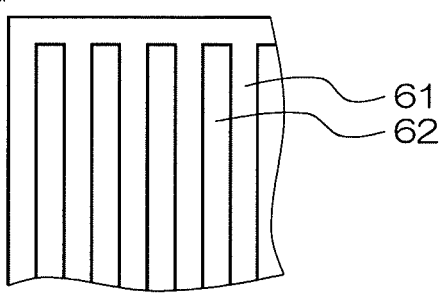
FIG. 2d is a schematic illustration for showing an example of a wiring pattern in the detection electrode provided in the operation face, an electric conductor of the wiring pattern being formed in a comb-like shape

The detection electrodes may respectively have area dimensions and shapes almost equal to those of the operation faces. The conductor wiring patterns of the detection electrodes may be arbitrarily selected. FIGS. 2a to 2d show examples of a conductor wiring pattern formed in each of the detection electrodes (31, 32). FIG. 2a is an example where an electric conductor 61 is uniformly formed in a whole area, and the FIGS. 2b and 2c are examples where the electric conductor 61 is formed in different net-like shapes. In FIG. 2b, regions 62 encompassed by the electric conductor 61 are smaller than in FIG. 2c. FIG. 2d is an example where the electric conductor 61 is formed in a comb-like shape. There may be other examples available. The wiring pattern of the electric conductor 61 may be suitably selected.

The wiring pattern of the detection electrode may differ from one operation face to another or may differ from an area (region) to another area of the detection electrode provided in an operation face. When a human body part is located in proximity of a detection electrode of an operation element, a capacitance generated in the detection electrode is increased. In general, a capacitance generated by a dielectric material in an electrode is in proportion to an area dimension of the electrode. Comparing two detection electrodes equally large, therefore, a larger capacitance is generated in the detection electrode having a denser wiring pattern than the other at the time of human body contact.

Referring to FIG. 1, a larger capacitance is generated in the detection electrode as the electric conductor of the electrode has a larger area dimension when viewed from a direction where the human body part 9 is approaching. Therefore, the capacitance generated in the detection electrode increases as the wiring pattern is densely formed (larger conductor area dimension in total per unit area), whereas the capacitance reduces as the wiring pattern is relatively sparsely formed (smaller conductor area dimension in total per unit area). Measuring the capacitance variations under the same conditions, the detection sensitivity for human body contact can differ from one detection electrode to another depending on wiring patterns employed therein although the detection electrodes are equally large. The wiring pattern is relatively dense in the operation face or a part of the operation face where the detection sensitivity is desirably increased, whereas the wiring pattern is relatively sparse in the operation face or a part of the operation face where the detection sensitivity is desirably lowered.

At least one of the detection electrodes provided in a operation face may includes a wiring pattern relatively sparsely formed in a vicinity area of a boundary with another operation face adjacent thereto, as compared to a wiring pattern of the detection electrode provided in the adjacent operation face. For example, the operation faces 21 and 22 are adjacently disposed in FIG. 1. In this case, if the wiring pattern of the detection electrode 31 formed in the certain region (boundary near region 311) near the operation face 22 is relatively sparsely formed as compared to the wiring pattern of the detection electrode 32, the detection sensitivity for human body contact is lowered in the boundary near region 311 of the detection electrode 31. The boundary near region 311 may be defined depending on a gap between the operation faces or shapes of the operation faces, for example, may be defined as a region from the boundary to the operation face adjacent thereto by a certain distance (about the size of fingertip). In the case where the human body part 9 contacts proximity of the boundary between the operation faces 21 and 22, it is decided that the contact is made on the operation face 22 because of a higher detection sensitivity in the detection electrodes 32 having a denser wiring pattern. That is, the processing prioritized for detecting by the operation face 22 is achieved when near the boundary between the operation faces 21 and 22 is touched.

The at least two operation faces may include a first operation face and a second operation face adjacent to the first operation face and having an smaller area dimension than the first operation face. In this case, the wiring pattern of the detection electrode provided in the second operation face may be more densely formed than the wiring pattern of the detection electrode provided in the first operation face. For example, the operation faces 21 and 22 shown in FIG. 1 are respectively called a first operation face 21 and a second operation face 22, and the first operation face 21 has a larger area dimension than the operation face 22. The wiring pattern of the detection electrode 32 of the second operation face 22 having a smaller area dimension is more densely formed than the wiring pattern of the detection electrode 31 of the first operation face 21 to confer a higher detection sensitivity for human body contact to the smaller second operation face 22.

The wiring pattern in a center area of the detection electrode provided in the first operation face may be denser than the wiring pattern in the vicinity area of the boundary to the second operation face. Referring to FIG. 1, for example, the wiring pattern in a center area 312 of the detection electrode 31 of the larger first operation face 21 is more densely formed than the wiring pattern of the boundary near regions 311. This increases the detection sensitivity in the center area 312 of the detection electrode 31 relative to the other areas, enabling to ensure that any contact by the human body part 91 with the center area of the first operation face 21 is detected.

Due to the structural restriction or the like of the operation elements, the electric conductor of the wiring may not be provided in some regions of the detection electrode of an operation face, for example, a region where fitting holes are formed in a base medium mounted with the detection electrodes, or a region with irregularity. Such a region is a non-wiring pattern region having a poor detectivity for human body contact with a relevant part of the operation face. Therefore, when the wiring pattern in the vicinity area of the non-wiring pattern region is more densely formed than a wiring pattern in a peripheral area of the vicinity area of the non-wiring pattern region, such a poor detection sensitivity is compensated. The vicinity area of the non-wiring pattern region is an area encompassing the non-wiring pattern region. When the wiring pattern of the vicinity area of the non-wiring pattern region is formed in such a uniform conductor pattern that is shown in FIG. 2a, a divisional deteriorating of the detection sensitivity of the operation face caused by the non-wiring pattern region is prevented.

2. Vehicle Interior Lighting Device Having Touch Switch

The touch switch described above can be used in any application as an operation switch in a variety of devices and equipments in indoor, vehicle interior or the like. An example of the in-vehicle use is a touch sensor for operating a plurality of operation switches installed in a narrow space, for example, vehicle interior lighting device, decorating panel, display panel, or air conditioner.

Figure 3:
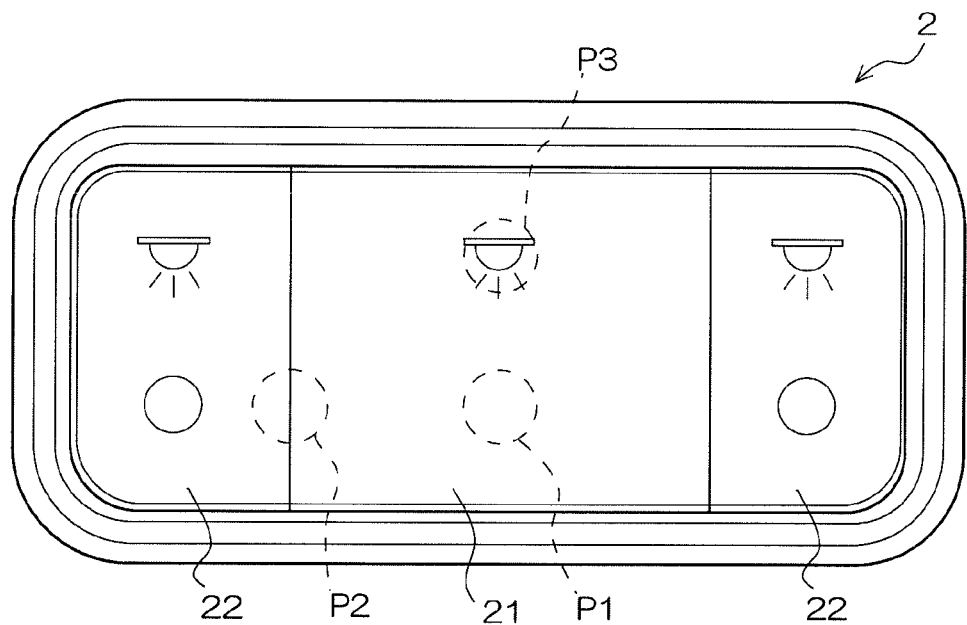
FIG. 3 is a front view of a vehicle interior lighting device equipped with touch switches.

FIG. 3 shows an example of the vehicle interior lighting device having the touch switches. A vehicle interior lighting device 2 is installed in a vehicle ceiling, wherein a first operation face 21 is provided at the center, and two second operation faces 22 having a smaller area dimension than the first operation face 21 are provided on the right and left sides of the first operation face 21. Below the first operation face 21 (rearward facing the drawing), a first light source (dome lamp) for illuminating the whole vehicle interior is installed, and below the second operation faces 22, second light sources (spot lamps) for illuminating right and left seats are installed, respectively. When a hand or a finger touches any of the operation faces, a controller 4 (not shown) detects the capacitance variation generated in the detection electrode and accordingly turns on or off the light sources corresponding to the touched operation face.

Figure 4:
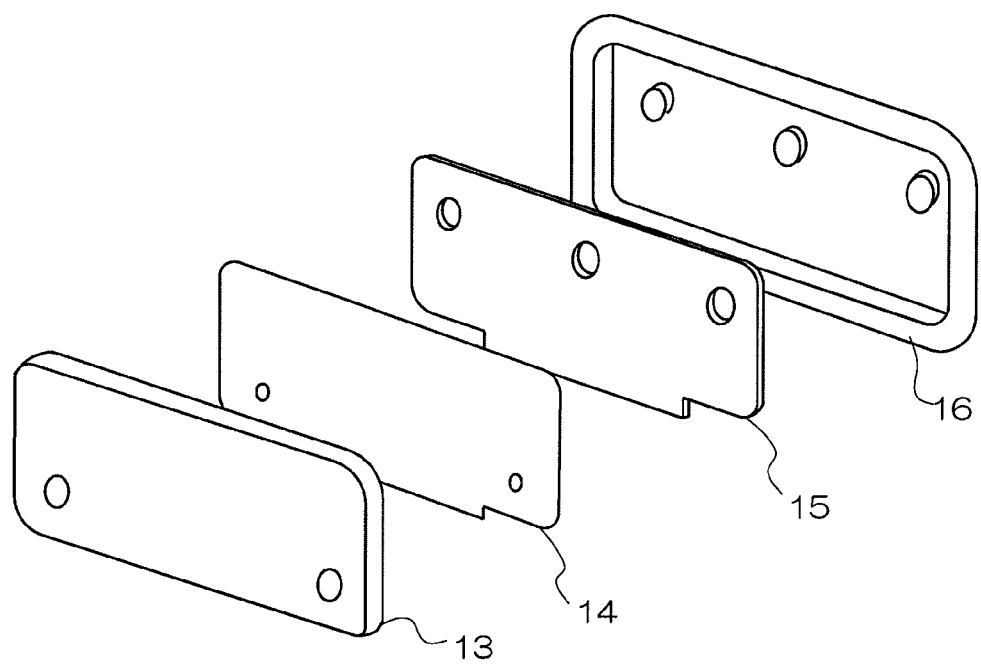
FIG. 4 is an exploded view illustrating structural characteristics of the vehicle interior lighting device equipped with touch switches.

FIG. 4 is an exploded view illustrating structural characteristics of the vehicle interior lighting device 2. The vehicle interior lighting device 2 has an outer cover plate 13 which doubles the operation faces and lenses, a light distributing film 14 which distributes light emitted from the first light source to the whole vehicle interior, a wiring board 15 for mounting thereon detection electrodes, first and second light sources, and indicator light sources for operation faces, and a bezel 16, wherein these structural members are combined in a multilayered structure. The controller 4 may be embedded in the wiring board 15 or may be provided in any other site (for example, in another ECU) and connected to the detection electrodes and light sources.

Figure 5:
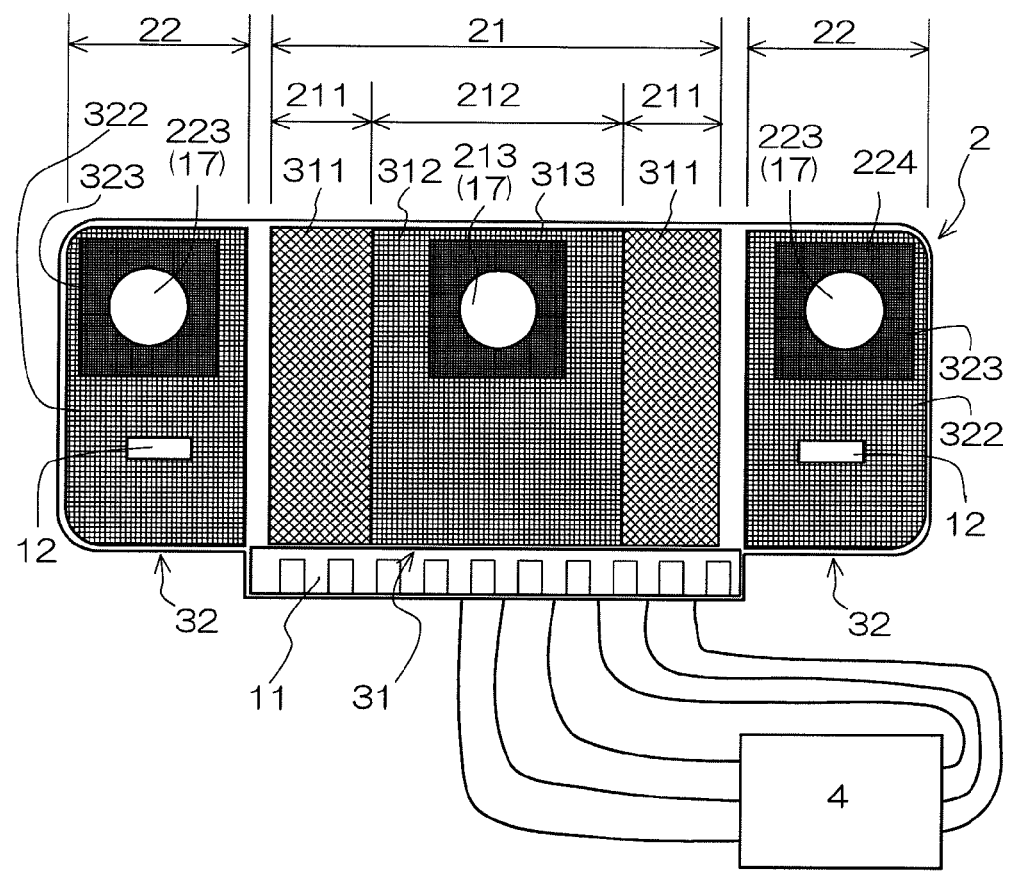
FIG. 5 is a front view of the vehicle interior lighting device showing wiring patterns in detection electrodes of the vehicle interior lighting device.

FIG. 5 shows layout of detection electrodes and the like on the wiring board 15. The wiring board 15 has a detection electrode 31 positioned immediately below the first operation face 21 provided in the outer cover plate 13, and detection electrodes 32 positioned immediately below the second operation faces 22. The wiring board 15 further has a first light source 11 which emits light outside from the whole area of the outer cover plate 13 (or mostly from the first operation face 21), and second light sources 12 which each emits light outside through the right and left operation faces 22. On the back side of the wiring board 15 are provided indicator light sources 17.

All of the first light source 11, second light sources 12, and indicator light sources 17 may be LED light sources or the like. The light emitted from the first light source 11 may be released from the whole area of the outer cover plate 13 by the light distributing film 14. The light emitted from each of the indicator light sources 17 arrives at a surface side (vehicle interior side) through through holes 213 and 223 formed in the wiring board 15.

The first detection electrode 31 and the second detection electrodes 32 are electrodes for detecting any human body contacts with the first and second operation faces 21 and 22, respectively. As shown in FIG. 5, different wiring patterns are applied to the respective detection electrodes and different areas of one detection electrode.

The wiring patterns in a center area 312 of the first detection electrode 31 and the second detection electrodes 32 are densely formed (see FIG. 2b). According to this configuration, any human body contacts with a center area 212 of the first operation face 21 and the second operation faces 22 can be detected almost equally. Depending on how densely or sparsely the wiring pattern is formed, the first operation face on the whole can have a detection sensitivity almost equal to the second operation faces.

As compared to these areas above, the conductor wiring in a boundary near region 311 of the first detection electrode 31 near the second operation face is sparsely formed (see FIG. 2c). When a human body part contacts near a boundary between the first and second operation faces 21 and 22, the controller 4 determines that the contact is intended for the second operation face 22 because of a higher detection sensitivity in the second detection electrode 32 than the first detection electrode 31. Generally, a user can easily touch a center area of a large operation face. However, he may find it difficult to touch a center area of a small operation face. The user may touch near the boundary between the first and second operation faces 21 and 22 when he tries to touch one of the operation faces 22. Thus, when the user touches near the boundary between the first and second operation faces, it is likely that he is trying to operate one of the second operation faces 22. Therefore, it is preferable to determine that a user intends to touch a small operation face whenever he happens to touch near a boundary between adjacent operation faces.

The operation faces of the vehicle interior lighting device 2 are provided with the indicators 17 (see FIG. 5). As shown in FIG. 5, the first detection electrode 31 and the second detection electrodes 32 of the wiring board 15 have through holes 213 and 223 for lights emitted from the indicators 17 to pass therethrough. The portions of the detection electrodes where these through holes are formed are non-wiring pattern regions. In the presence of the non-wiring pattern regions, human body contact for any of the indicators is detected with a poor detection sensitivity. A solution for compensating such a poor detection sensitivity is to provide a denser wiring pattern in the vicinity area of the non-wiring pattern regions (313, 323) than in peripheral areas thereof (312, 322). For example, the pattern shown in FIG. 2a where the conductor is uniformly formed in the whole area is employed as the wiring patterns in the vicinity area of the non-wiring pattern regions 313 and 323. This prevents the detection sensitivity from deteriorating. As a result, any contacts by a user with the indicators on the operation faces are reliably detected.

The controller 4 periodically measures the capacitance variations of the first detection electrode 31 and the second detection electrodes 32. When the variations are at least a certain level, the controller 4 detects the occurrence of any contact and turns on or off the light source 11 or 12 of the contacted operation face. When the light sources 11 and 12 are powered off, the controller 4 may turn on the relevant indicator lamp 17.

Figure 6:
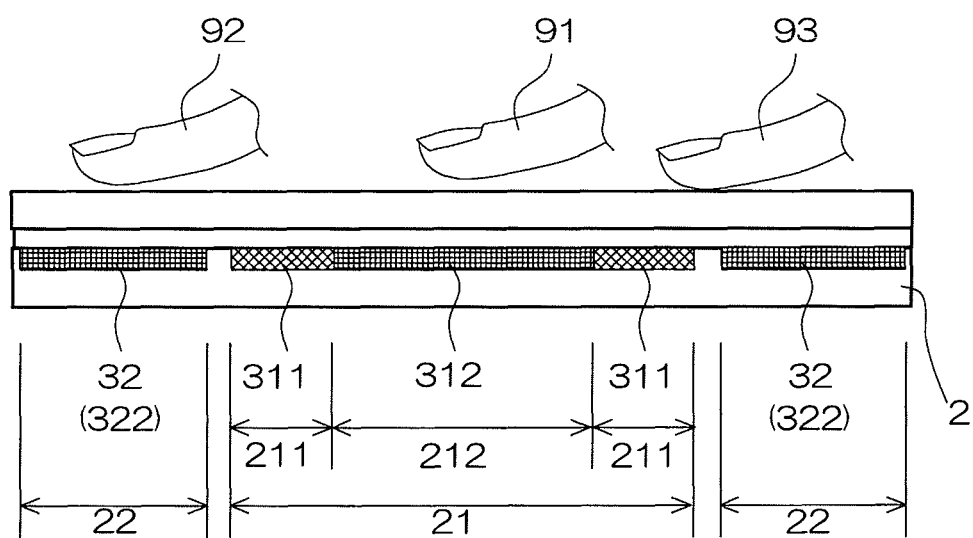
FIG. 6 is a schematic illustration of contacts made by a fingertip with operation faces.

FIG. 6 shows a sectional view of the vehicle interior lighting device 2 centered on the detection electrodes. According to the vehicle interior lighting device 2 described above, when a user needs the whole vehicle interior to be illuminated, he can turn on the first light source 11 (dome lamp) by touching the central first operation face 21 provided with the first detection electrode 31 with his finger 91. When the user needs a part of the vehicle interior to be illuminated, he can turn on the relevant second light source 12 (spot lamp) by touching one of the relevant second operation faces 22 with his finger 92. According to the vehicle interior lighting device 2, the user can spontaneously turn on or off the light source by simply touching a position where the light source 11 or 12 to be turned on or off is located.

When the finger 93 contacts near the boundary between the first and second operation faces 21 and 22, the second detection electrode 32 is more likely to detect the contact because of a lower detection sensitivity in the boundary near region 311 of the first detection electrode 31 where the wiring pattern is sparse. Then, the second light source 12 is turned on. This makes it less likely that the first light source 11 is turned on by mistake because of a smaller area dimension of the second operation face 22.

It is not necessary that the operation faces (detection electrodes) and the light sources are provided in a one-on-one manner. The operation faces and the light sources may be arbitrarily provided. For example, two operation faces may be provided for one light source to turn on and off the light source, or the illumination may be dimmed by arranging different degrees of brightness on the operation faces.

A mechanical switch and touch switches encompassing the mechanical switch may be provided, wherein a wiring pattern near the mechanical switch is formed in a relatively sparse. Accordingly, any of the touch switches are prevented from accidentally starting any unintended operation when the mechanical switch is manipulated, and a detectable range of the touch switches can be extended to proximity of the mechanical switch.

3. Detection Sensitivity Change in Different Contact Parts

The following measurement was performed to confirm that the detection sensitivity of the boundary near region 311 of the first detection electrode 31 is lower than any other parts and the detection sensitivity in the vicinity area of the non-wiring pattern region 213 is equal to that of any other parts in the vehicle interior lighting device 2. The wiring patterns in the center area 312 of the first detection electrode 31 and the second detection electrodes 32 were set the wire width to 0.5 mm and the mesh spacing to 2 mm, while the wiring pattern in the boundary near region 311 of the first detection electrode 31 was set the wire width to 0.5 mm and the mesh spacing to 4 mm. The electric conductor was uniformly formed in the whole area in the vicinity area 313 of the non-wiring pattern region 213.

The capacitance variations were measured by touching with a finger three positions, P1, P2, and P3 shown in FIG. 3. The point P1 was a near-center point of the center area 312 of the first operation face 21, the point P2 was on the boundary between the first and second operation faces 21 and 22, and the point P3 was a center point of the non-wiring pattern region 213. A circuit (AD converter) of the controller 4 was used for capacitance measurement. A capacitance value measured when the finger was not in contact with any of the points was used as a reference value (value 0), and a reduction of the measured value when each point was touched by the finger was calculated as "a capacitance variation value".

Figure 7:
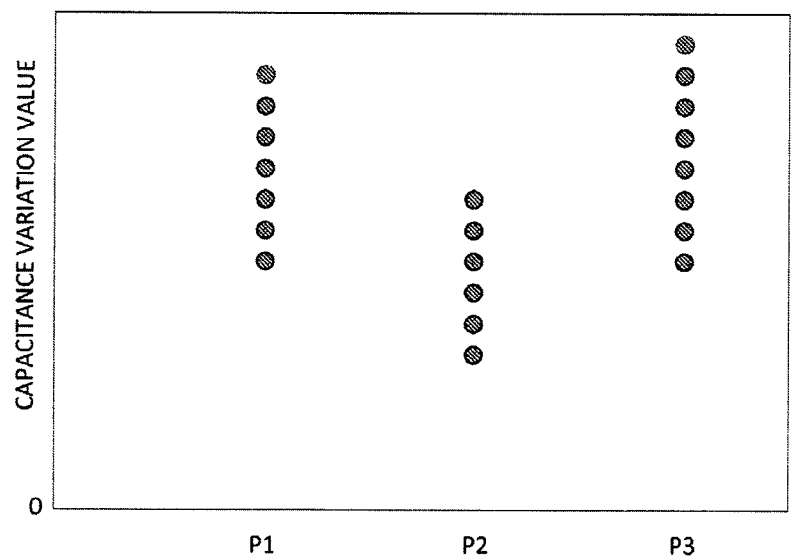
FIG. 7 is a graph illustrating detected different capacitance values depending on different wiring patterns of the detection electrode.

FIG. 7 shows 20 capacitance variation values thus measured at the respective points. As shown in the drawing, the capacitance variation values when the point P2, that is the boundary near region 211 of the first operation face 21 near the boundary to the second operation face 22, was touched were lower on average than the capacitance variation values when the point P1, that is the center area 212 of the first detection electrode 31, was touched. A largest value and a smallest value of the capacitance variation values lowered to such an extent that was almost equal to the average value. It is known from the measurement result that the detection sensitivity at the point P2 was lower than the detection sensitivity at the point P1. This indicates that any contact by the finger with the boundary between the first and second operation faces 21 and 22 is more likely to be detected on the second operation face 22 having a higher detectivity.

The capacitance variation values at the point P1 in the center area 212 and the capacitance variation values at the point P3, that is in the vicinity area of the non-wiring pattern region 213, had a substantially equal average value, proving that the detection sensitivity at the point P1 and the detection sensitivity at the point P3 were substantially equal. Therefore, any contact at the point P3 with no wiring pattern immediately therebelow could be detected as well as the point P1, and the relevant operation face was equally operable.

The invention is not necessarily limited to the exemplary embodiment described thus far but may be variously modified within the technical scope of the invention depending on objects and intended usages. The vehicle interior lighting device according to the exemplary embodiment is structurally and technically characterized in that three operation faces are provided, and lamps respectively provided for these operation faces are turned on/off. The invention is not necessarily limited thereto but may use two operation faces and two lamps respectively provided for the operation faces to be thereby turned on/off, or four or more operation faces and four or more lamps respectively provided for the operation faces to be thereby turned on/off.

It is noted that the foregoing examples have been provided merely for the purpose of explanation and are in no way to be construed as limiting of the present invention. While the present invention has been described with reference to exemplary embodiments, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular structures, materials and embodiments, the present invention is not intended to be limited to the particulars disclosed herein; rather, the present invention extends to all functionally equivalent structures, methods and uses, such as are within the scope of the appended claims.

The present invention is not limited to the above-described embodiments, and various variations and modifications may be possible without departing from the scope of the present invention.

What is claimed is:

1. A touch switch, comprising:
   at least two operation faces provided side by side;
   a detection electrode provided in each of the at least two operation faces and including a wiring pattern of an electric conductor that is one of defined on or defined immediately below the operation face; and
   a controller connected to each of the detection electrodes to perform a switching operation by detecting variations of capacitance sensed by each of the detection electrodes, the variation of capacitance being generated when an electrically conductive object is at least one of in proximity to or in contact with each of the operation faces, wherein
   at least one of the detection electrodes includes a wiring pattern defined in a vicinity area of a boundary with another operation face adjacent thereto that is less dense than a wiring pattern of the detection electrode provided in the adjacent operation face.

2. The touch switch according to claim 1, wherein
   the at least two operation faces include a first operation face and a second operation face adjacent to the first operation face, the second operation face having an smaller area dimension than the first operation face, and
   a wiring pattern of the detection electrode provided in the second operation face is more dense than a wiring pattern of the detection electrode provided in the first operation face.

3. The touch switch according to claim 2, wherein
   a wiring pattern in a center area of the detection electrode provided in the first operation face is more dense than a wiring pattern in a vicinity area of a boundary with the second operation face.

4. The touch switch according to claim 1, wherein
   a part of the detection electrode is provided with a non-wiring pattern region, and
   a wiring pattern in a vicinity area of the non-wiring pattern region is more dense than a wiring pattern in a peripheral area of the vicinity area of the non-wiring pattern region.

5. A vehicle interior lighting device, comprising:
   the touch switch according to claim 1, wherein
   the controller controls relevant lighting of a vehicle interior by detecting at least one of an electrically conductive object in proximity of or in contact with any of the at least two operation faces.

* * * * *